(12) United States Patent
Kim et al.

(10) Patent No.: US 7,737,748 B2
(45) Date of Patent: Jun. 15, 2010

(54) LEVEL SHIFTER OF SEMICONDUCTOR DEVICE AND METHOD FOR CONTROLLING DUTY RATIO IN THE DEVICE

(75) Inventors: Jin-Gook Kim, Suwon-si (KR);
Seung-Jun Bae, Daejeon (KR);
Dae-Hyun Chung, Daejeon (KR)

(73) Assignee: Samsung Electronics Co., Ltd. (KR)

( * ) Notice: Subject to any disclaimer, the term of this patent is extended or adjusted under 35 U.S.C. 154(b) by 191 days.

(21) Appl. No.: 11/986,841

(22) Filed: Nov. 27, 2007

(65) Prior Publication Data
US 2008/0186075 A1 Aug. 7, 2008

(30) Foreign Application Priority Data
Feb. 1, 2007 (KR) .................. 10-2007-0010615

(51) Int. Cl.
*H03K 3/017* (2006.01)
(52) U.S. Cl. ............................. 327/175; 327/333
(58) Field of Classification Search ............. 327/333, 327/427, 437, 175; 326/62, 80, 81
See application file for complete search history.

(56) References Cited

U.S. PATENT DOCUMENTS

| | | | | |
|---|---|---|---|---|
| 5,969,542 | A * | 10/1999 | Maley et al. | 326/81 |
| 6,002,290 | A * | 12/1999 | Avery et al. | 327/333 |
| 6,933,755 | B2 * | 8/2005 | Hong et al. | 327/108 |
| 7,148,735 | B2 | 12/2006 | Ito et al. | |
| 7,352,228 | B2 * | 4/2008 | Ali et al. | 327/333 |
| 7,468,615 | B1 * | 12/2008 | Tan et al. | 326/68 |
| 7,471,105 | B2 | 12/2008 | Kim | |
| 2004/0085114 | A1 | 5/2004 | Hong et al. | |
| 2004/0155693 | A1 | 8/2004 | Ito et al. | |
| 2005/0258887 | A1 | 11/2005 | Ito et al. | |
| 2006/0125521 | A1 | 6/2006 | Kim | |
| 2006/0139059 | A1 | 6/2006 | Jeong | |

FOREIGN PATENT DOCUMENTS

| | | |
|---|---|---|
| JP | 2004-236164 | 8/2004 |
| JP | 2006-262074 | 9/2006 |
| KR | 10-2004-0039592 | 5/2004 |
| KR | 1020040039582 A | 5/2004 |
| KR | 10-2005-0122292 | 12/2005 |
| KR | 10-2006-0067772 | 6/2006 |
| KR | 10-2006-0073804 | 6/2006 |

* cited by examiner

*Primary Examiner*—Hai L Nguyen
(74) *Attorney, Agent, or Firm*—Mills & Onello, LLP (57) ABSTRACT

A level shifter of a semiconductor device and method of controlling a duty ratio are provided. The level shifter includes first and second PMOS transistors having sources to which a power supply voltage is applied, first and second NMOS transistors having sources to which a ground voltage is applied, third and fourth NMOS transistors having sources connected to drains of the first and second NMOS transistors and gates to which the power supply voltage is applied; and a voltage controlled delay unit for receiving an input signal applied to a gate of the first NMOS transistor, inverting a level of the input signal, determining whether a voltage of an inverted input signal should be charged in response to a voltage control signal, outputting the voltage of the inverted input signal of which delay time is controlled, and applying the inverted input signal to a gate of the second NMOS transistor.

17 Claims, 5 Drawing Sheets

LEVEL SHIFTER OF SEMICONDUCTOR DEVICE AND METHOD FOR CONTROLLING DUTY RATIO IN THE DEVICE

This application claims priority under 35 U.S.C. 119 to Korean Patent Application No. 10-2007-0010615, filed Feb. 1, 2007, the contents of which are hereby incorporated herein by reference in their entirety.

BACKGROUND OF THE INVENTION

1. Field of the Invention

The present invention relates to a level shifter of a semiconductor device and, more particularly, to a level shifter of a semiconductor device capable of shifting the level of an output signal while precisely controlling a duty ratio of the output signal in a high-speed semiconductor device having operating performance that is sensitive even to slight distortion of the signal, and a method for controlling a duty ratio in the semiconductor device.

2. Description of Related Art

A power supply voltage keeps dropping with the rapid development of fine processing techniques. In order to meet the required specifications of high-speed systems such as high-speed digital communication systems, high-definition high-speed display devices, and mass storage devices, analog and digital blocks of the high-speed systems have been increasingly employing a plurality of power supply voltages. However, some semiconductor devices or some circuits for semiconductor devices require high voltages for operating characteristics. Therefore, when semiconductor devices or internal circuits thereof need high operating voltages, a voltage interface, for example, a level shifter, is required.

Meanwhile, two signals applied to an input terminal of a level shifter are delayed by different times and different times are taken to output a high-potential signal and a low-potential signal.

Meanwhile, two signals are input with different delay times to an input terminal of a level shifter, and high- and low-potential signals are output with different delay times from the level shifter. In other words, shifting the level of any signal changes a duty ratio of the signal, i.e., a ratio of a high-level duration to one signal cycle, resulting in an output signal with the duty cycle changed.

The duty ratio of the level shifter is critical in supplying a sampled clock signal to an analog block, such as an analog-to-digital converter (ADC). The performance of a clock-based analog block greatly depends on the duty ratio of an input clock. Therefore, due to a change in the duty ratio, the level shifter might not be applicable to high-speed semiconductor devices.

Figure 1:
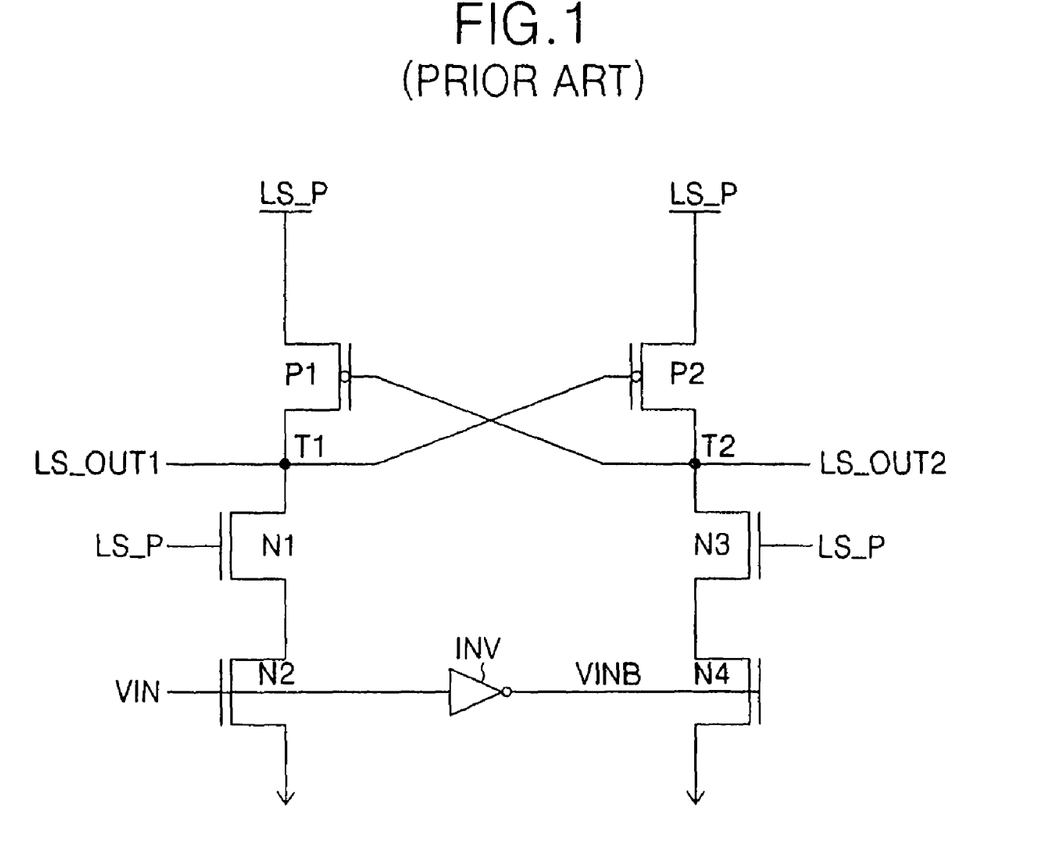
FIG. 1 is a circuit diagram of a conventional level shifter of a semiconductor device.

FIG. 1 is a circuit diagram of a conventional level shifter of a semiconductor device.

Referring to FIG. 1, the level shifter includes four NMOS transistors N1 to N4, two PMOS transistors P1 and P2, and an inverter INV.

A power supply voltage LS_P is applied in common to sources of the first and second PMOS transistors P1 and P2 and gates of the first and third NMOS transistors N1 and N3. A series connection of the first and second NMOS transistors N1 and N2 with one side grounded is connected to a drain of the first PMOS transistor P1. Also, a series connection of the third and fourth NMOS transistors N3 and N4 with one side grounded is connected to a drain of the second PMOS transistor P2.

An input signal VIN is applied to a gate of the second NMOS transistor N2. The input signal VIN is inverted by the inverter INV so that an inverted input signal VINB is applied to a gate of the fourth NMOS transistor N4. A gate of the first PMOS transistor P1 is connected to the drain of the second PMOS transistor P2 to form a second output terminal LS_OUT2. Also, a gate of the second PMOS transistor P2 is connected to the drain of the first PMOS transistor P1 to form a first output terminal LS_OUT1.

The operation of the conventional level shifter of the semiconductor device shown in FIG. 1 will now be described.

First, since the power supply voltage LS_P is applied in common to the gates of the first and third NMOS transistors N1 and N3, the first and third NMOS transistors N1 and N3 are turned on.

When the input signal VIN is at a low level, the second NMOS transistor N2 is turned off, and the fourth NMOS transistor N4 is turned on. Accordingly, since a voltage of a node T2 is at the level of a ground voltage Vss, the first PMOS transistor P1 is turned on. Then, since a voltage of a node T1 becomes at the level of the power supply voltage LS_P, the second PMOS transistor P2 is turned on. Since the voltage of the node T1 is at the level of the power supply voltage LS_P, the level of the power supply voltage LS_P is output from the first output terminal LS_OUT1. Also, since the voltage of the node T2 is at the level of the ground voltage Vss, the level of the ground voltage Vss is output from the second output terminal LS_OUT2.

When the input signal VIN is at a high level, the second NMOS transistor N2 is turned on, and the fourth NMOS transistor N4 is turned off. Accordingly, since the voltage of the node T1 is at the level of the ground voltage Vss, the second PMOS transistor P2 is turned on. Then, since the voltage of the node T2 becomes at the level of the power supply voltage LS_P, the first PMOS transistor P1 is turned off. Since the voltage of the node T1 is at the level of the ground voltage Vss, the level of the ground voltage Vss is output from the first output terminal LS_OUT1. Also, since the voltage of the node T2 is at the level of the power supply voltage LS_P, the level of the power supply voltage LS_P is output from the second output terminal LS_OUT2.

Figure 2:
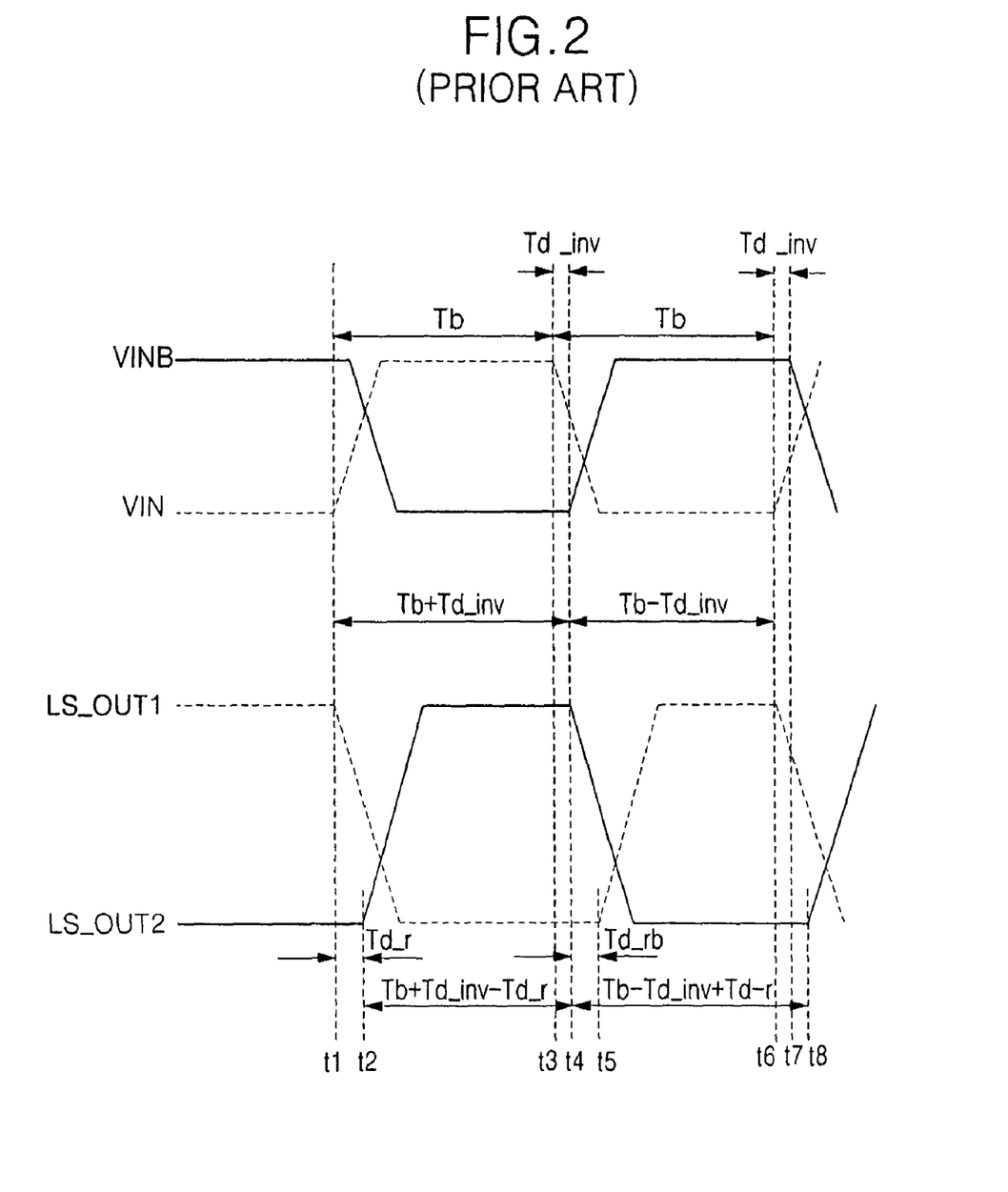
FIG. 2 is a timing diagram illustrating the operation of the conventional level shifter of the semiconductor device shown in FIG. 1.

FIG. 2 is a timing diagram illustrating the operation of the conventional level shifter of the semiconductor device shown in FIG. 1. In FIG. 2, VIN denotes an input signal, VINB denotes an inverted input signal, LS_OUT1 denotes a negative output signal of the level shifter, and LS_OUT2 denotes appositive output signal of the level shifter.

The input signal VIN toggles between a low level and a high level in a predetermined bit cycle. The bit cycle includes a high bit cycle Tb in which the input signal VIN makes a low-to-high transition, remains at a high level, and drops to a low level, and a low bit cycle Td in which the input signal VIN makes a high-to-low transition, remains at a low level, and rises to a high level.

The inverted input signal VINB is obtained by inverting the input signal VIN using the inverter INV. The inverted input signal VINB is delayed by an inverter delay time Td_inv later than the input signal VIN.

The positive output signal LS_OUT2 makes a transition to the level of a power supply voltage LS_P, which is delivered after a predetermined rising delay time Td_r via the second PMOS transistor P2 that is turned on in response to the input signal VIN, makes a transition to the level of a ground voltage Vss, which is delivered via the fourth NMOS transistor N4 that is turned on in response to the inverted input signal VINB, and is output.

The negative output signal LS_OUT1 makes a transition to the level of the ground voltage Vss, which is delivered via the second NMOS transistor N2 that is turned on in response to the input signal VIN, makes a transition to the level of the power supply voltage LS_P, which is delivered after a predetermined rising delay time Td_r via the first PMOS transistor P1 that is turned on in response to the inverted input signal VINB, and is output.

In this case, when neglecting the delay time Td_inv of the inverter INV, the output signals LS_OUT1 and LS_OUT2 of the level shifter have rising delay times that are longer than falling delay times. This is due the fact that the output signals LS_OUT1 and LS_OUT2 fall directly after the inverted input signal VINB rises to a high level and the fourth NMOS transistor N4 is turned on, while the output signals LS_OUT1 and LS_OUT2 of the level shifter do not rise until the input signal VIN rises to a high level, the inverted input signal VINB drops to a low level, and the second PMOS transistor P2 transmits the power supply voltage LS_P.

The operation of the conventional level shifter of the semiconductor device will now be described with reference to FIGS. 1 and 2.

First, since the power supply voltage LS_P is applied in common to the gates of the first and third NMOS transistors N1 and N2 of the level shifter 12, the NMOS transistors N1 and N2 are turned on.

When the input signal VIN makes a low-to-high transition at a point in time t1, the second NMOS transistor N2 is turned on and thus, the level of the ground voltage Vss is delivered to the node T1 and a voltage level of the first output terminal LS_OUT1 directly drops to the level of the ground voltage Vss.

When the level of the ground voltage Vss of the node T1 is applied to the gate of the second PMOS transistor P2, the second PMOS transistor P2 is turned on. Thus, the level of the power supply voltage LS_P of the second output terminal LS_OUT2 is delayed by a predetermined rising delay time Td_r and delivered to the node T2, so that the positive output signal LS_OUT2 makes a transition to the level of the power supply voltage LS_P at a point in time t2 after the rising delay time Td_r.

Thereafter, when the input signal VIN makes a high-to-low transition at a point in time t3, a high-level voltage is applied via the inverter INV to the gate of the fourth NMOS transistor N4. Thus, the fourth NMOS transistor N4 is turned on and the level of the ground voltage Vss is delivered to the node T2, so that a voltage level of the second output terminal LS_OUT2 drops to the level of the ground voltage Vss at a point in time t4 after an inverter delay time Td_inv.

When the level of the ground voltage Vss of the node T2 is applied to the gate of the first PMOS transistor P1, the first PMOS transistor P1 is turned on. Thus, the level of the power supply voltage LS_P of the first output terminal LS_OUT1 is delayed by a predetermined rising delay time Td_rb and delivered to the node T1, so that the negative output signal LS_OUT1 makes a transition to the level of the power supply voltage LS_P at a point in time t5 after the rising delay time Td_rb.

In general, the level shifter receives the input signal VIN and generates the positive output signal LS_OUT2 and the negative output signal LS_OUT1. However, because the level shifter outputs only one output signal LS_OUT2 and uses the other output signal LS_OUT1 to shift the voltage level of the input signal VIN, the duty ratios of the output signals LS_OUT1 and LS_OUT2 can be different.

Accordingly, since a ratio of a high bit cycle of an output signal to the entire bit cycle of the output signal is defined as a duty ratio of the output signal, the duty ratio of the positive output signal LS_OUT2, which is used as a substantial output signal of the level shifter, should be ½, i.e., 50%, while the duty ratio of the negative output signal LS_OUT1, which is used to shift the level of the input signal VIN, may not be 50%.

Referring to FIG. 2, a high bit cycle and a low bit cycle of the input signal VIN correspond to the original high bit cycle Tb and the original low bit cycle Td, respectively. However, a high bit cycle of the positive output signal LS_OUT2 is given by subtracting the rising delay time Td_r of the positive output signal LS_OUT2 from the sum of the current high bit cycle Tb and the inverter delay time Td_inv, and a low bit cycle of the positive output signal LS_OUT2 is given by taking the sum of the rising delay time Td_r of the positive output signal LS_OUT2 and a time given by subtracting the inverter delay time Td_inv from the current high bit cycle Tb.

Therefore, the entire bit cycle of the positive output signal LS_OUT2 becomes 2Tb and the high bit cycle of the positive output signal LS_OUT2 becomes Tb+Td_inv-Td_r, so that the duty ratio of the positive output signal LS_OUT2 may not exactly be 50%.

In the conventional art as described above, the inverted input signal VINB is delayed by a predetermined delay time due to the inverter INV and drops to a low level later than the input signal VIN. Thus, problems caused when a rising delay time Td_r of the output signal LS_OUT2 of the level shifter is longer than a falling delay time thereof can be reduced. However, in the semiconductor device having operating performance that is sensitive even to slight distortion of an output waveform, it is difficult to precisely control the duty ratio of the output signal LS_OUT2 by using the inverter INV that greatly varies a delay time and a duty ratio according to the size of a transistor.

SUMMARY OF THE INVENTION

In accordance with the present invention there is provided a level shifter of a semiconductor device, which variably controls the delay time of an input signal by controlling an internal signal of the semiconductor device or by sensing the duty ratio of an output signal of the level shifter, so that the duty ratio of the output signal can be efficiently controlled.

Also in accordance with the present invention three is provided a method for controlling a duty ratio using the level shifter of the semiconductor device.

In one aspect, the present invention is directed to a level shifter of a semiconductor device, including an voltage controlled delay unit configured to receive an input signal, invert a level of the input signal, and delay the inverted input signal to output a delayed inverted signal, a delay time of the delayed inverted signal being adjusted in a manner that performs a charging operation with the inverted signal in response to a delay control signal; and a level shifting unit configured to amplify a voltage difference between the input signal and the delayed inverted signal to output a pair of level-shifted signals having different phases.

The level shifting unit can include: a voltage difference generating portion configured to sense a voltage difference between the input signal and the delayed inverted signal in response to the input signal and the delayed inverted signal to generate a voltage difference generated between a pair of input nodes; a voltage difference delivering portion configured to deliver the voltage difference generated between the pair of input nodes to a pair of output nodes in response to a power supply voltage; and a level-shifted signal output portion configured to amplify the voltage difference delivered to the pair of output nodes to output the pair of level-shifted signals.

The voltage difference generating portion can comprise: a first NMOS transistor having a source to which a ground voltage is applied and a gate to which the input signal is applied; and a second NMOS transistor having a source to which the ground voltage is applied and a gate to which the delayed inverted signal is applied.

The voltage difference delivering portion can comprise: a third NMOS transistor having a source connected to a drain of the first NMOS transistor and a gate to which the power supply voltage is applied; and a fourth NMOS transistor having a source connected to a drain of the second NMOS transistor and a gate to which the power supply voltage is applied.

The level-shifted signal output portion can comprise: a first PMOS transistor having a source to which the power supply voltage is applied and a gate to which one of the pair of level-shifted signals is applied; and a second PMOS transistor having a source to which the power supply voltage is applied and a gate to which the other of the pair of level-shifted signals is applied. The pair of level-shifted signals are output from a connection point between the first PMOS transistor and the third NMOS transistor and a connection point between the second PMOS transistor and the fourth NMOS transistor.

The voltage controlled delay unit can include an inverter configured to receive the input signal and to invert a level of the input signal to output an inverted input signal to the gate of the second NMOS transistor; a capacitor having one terminal to which the ground voltage is applied; and a fifth NMOS transistor having a drain to which an output signal of the inverter is applied and a gate connected to the other terminal of the capacitor, and configured to deliver the output signal of the inverter to the capacitor to charge the capacitor with the output signal in response to the delay control signal applied to a gate of the fifth NMOS transistor.

The voltage controlled delay unit can be configured to use a mode register set (MRS) signal as the delay control signal. The MRS signal can be originated from predetermined data bits of a mode register in the semiconductor device.

The voltage controlled delay unit can be configured to use a fuse option as the delay control signal. Thus, the voltage controlled delay unit can be configured to output a low-level fuse option when a fuse included in the semiconductor device is connected, and to output a high-level fuse option when the fuse is disconnected.

The voltage controlled delay unit can be configured to adjust a delay time of the inverter to equalize a rising delay time of one of the pair of level-shifted signals to the delay time of the inverter so that a duty ratio of the one of the pair of level-shifted signals can be precisely controlled.

In the voltage controlled delay unit, when the delay control signal is at a high level, the fifth NMOS transistor can be configured to turn on so that a voltage of the inverted input signal is charged in the capacitor to increase the inverter delay time, and when the delay control signal is at a low level, the fifth NMOS transistor can be configured to turn off so that the voltage of the inverted input signal is not charged in the capacitor not to increase the inverter.

The level shifter can further include a duty ratio detector configured to receive one of the pair of level-shifted signals and to detect a duty ratio of the received level-shifted signal to output the delay control signal according to the distortion extent of the received level-shifted signal.

The duty ratio detector can include: a first PMOS transistor pair including third and fourth PMOS transistors connected in parallel and having sources to which the power supply voltage is applied; a second PMOS transistor pair including fifth and sixth PMOS transistors connected in parallel and having sources to which the power supply voltage is applied; fifth and sixth NMOS transistors having drains connected to drains of the first and second pairs of PMOS transistors, respectively; a seventh NMOS transistor having a drain connected to the drains of the fifth and sixth NMOS transistors, a source connected to the ground voltage, and a gate to which a bias voltage is applied; and a capacitor having one terminal connected to a first connection point between the first pair of PMOS transistors and the fifth NMOS transistor and the other terminal connected to a second connection point between the second pair of PMOS transistors and the sixth NMOS transistor. The first connection point can be connected to gates of the third and fifth PMOS transistors and the second connection point can be connected to gates of the fourth and sixth PMOS transistors so that one of the pair of level-shifted signals is applied to a gate of the fifth NMOS transistor, a reference voltage signal is applied to a gate of the sixth NMOS transistor, and the duty ratio detector compares a voltage level of the applied one of the pair of level-shifted signals with a voltage level of the reference voltage signal and outputs the delay control signal from the second connection point.

The duty ratio detector can be configured to output a low-level delay control signal when the duty ratio of one of the pair of level-shifted signals does not exceed a predetermined value, and to output a high-level delay control signal when the duty ratio of the one of the pair of level-shifted signals exceeds the predetermined value.

In accordance with another aspect, the present invention is directed to a method for controlling a duty ratio using a level shifter of a semiconductor device. The level shifter includes: an voltage controlled delay unit including an inverter configured to receive an input signal, a capacitor having one terminal to which a ground voltage is applied, and an NMOS transistor having a gate to which a delay control signal is applied, the level shifter configured to shift a level of the input signal to output a pair of level-shifted signals. The method includes: receiving the input signal and inverting the level of the input signal to output an inverted input signal; determining whether or not a voltage of the input signal is to be charged in the capacitor based on a level of the delay control signal; controlling a delay time of the input signal depending on whether or not the voltage of the input signal is charged in the capacitor to output a delayed input signal; and controlling a duty ratio of one of the pair of level-shifted signals using the delayed input signal.

Controlling the delay time of the input signal depending on whether or not the voltage of the input signal is charged in the capacitor to output the delayed input signal can include: when the delay control signal is at a low level, not charging a voltage of the inverted input signal in the capacitor to output the inverted input signal without increasing a delay time of the inverted input signal; and when the delay control signal is at a high level, charging the voltage of the inverted input signal in the capacitor to output the inverted input signal with an increased delay time.

Determining whether or not the voltage of the input signal is to be charged in the capacitor based on the level of the delay control signal can be performed using a mode register set (MRS) signal as the delay control signal. The MRS signal can be originated from predetermined data bits of a mode register in the semiconductor device.

Determining whether or not the voltage of the input signal is to be charged in the capacitor based on the level of the delay control signal can be performed using a fuse option as the delay control signal, wherein a low-level fuse option when a fuse included in the semiconductor device is connected, and a high-level fuse option when the fuse is disconnected.

Controlling a duty ratio of one of the pair of level-shifted signals using the delayed input signal can include controlling a delay time of the inverter to equalize a rising delay time of an output signal to the delay time of the inverter to delay a point in time at which the output signal rises so that a duty ratio of the output signal can be precisely controlled.

Determining whether or not the voltage of the input signal is to be charged in the capacitor based on the level of the delay control signal can include receiving one of the pair of level-shifted signals, detecting a duty ratio of the received level-shifted signal to generate the delay control signal according to the distortion extent of the received level-shifted signal.

Receiving one of the pair of level-shifted signals, detecting a duty ratio of the received level-shifted signal to generate the delay control signal according to the distortion extent of the received level-shifted signal can include outputting a low-level delay control signal when the duty ratio of one of the pair of level-shifted signals does not exceed a predetermined value and outputting a high-level delay control signal when the duty ratio of the one of the pair of level-shifted signals exceeds the predetermined value.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating the principles of the invention.

DETAILED DESCRIPTION OF EXEMPLARY EMBODIMENTS

Hereinafter, aspects of the present invention will be described by explaining illustrative embodiments in accordance therewith, with reference to the attached drawings. While describing these embodiments, detailed descriptions of well-known items, functions, or configurations are typically omitted for conciseness.

It will be understood that, although the terms first, second, etc. are be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

A level shifter of a semiconductor device and a method for controlling a duty ratio using the same according to aspects of the present invention will now be described more fully hereinafter with reference to the accompanying drawings, in which exemplary embodiments of the invention are shown.

Figure 3:
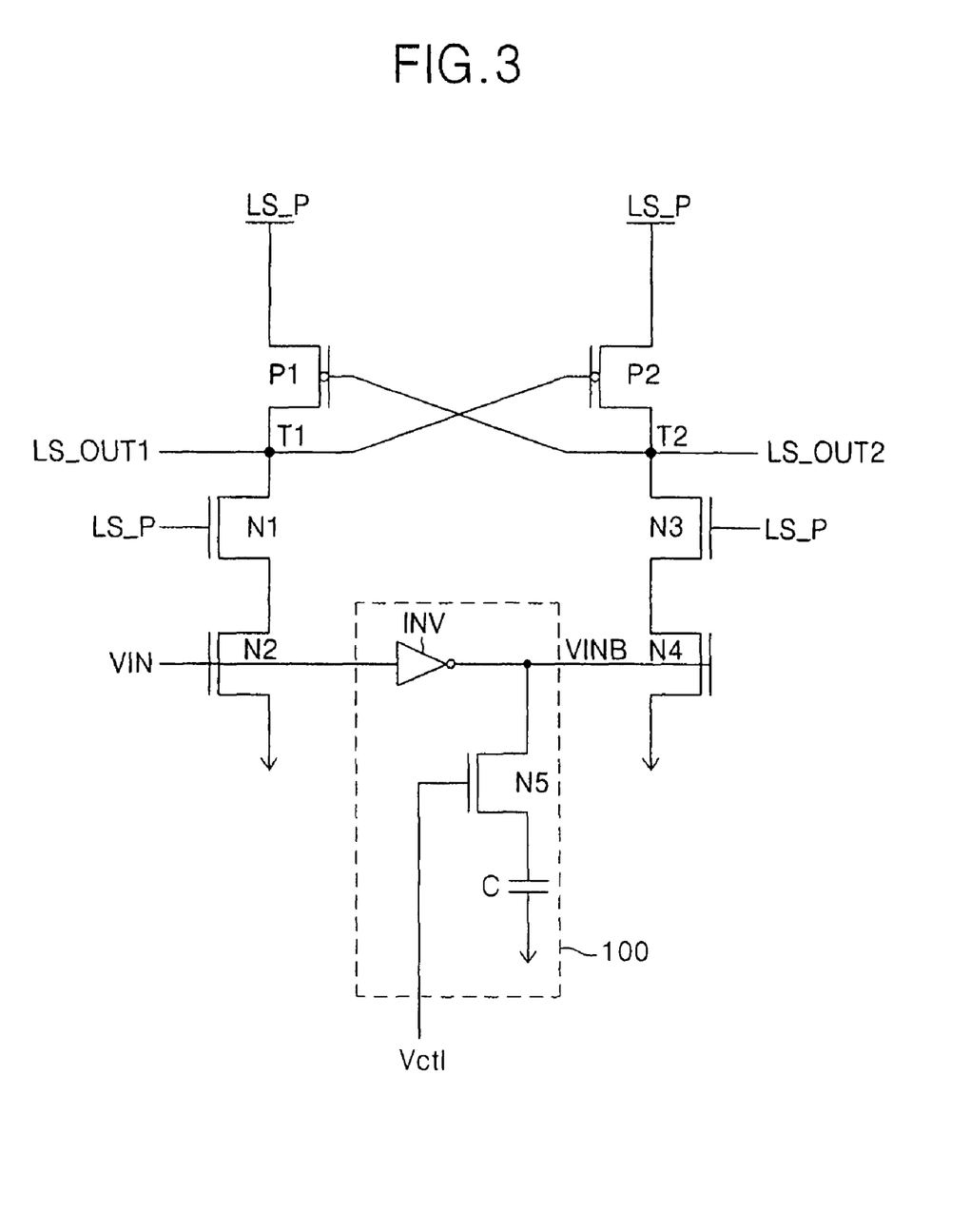
FIG. 3 is a circuit diagram of an embodiment of a level shifter of a semiconductor device according to an aspect of the present invention.

FIG. 3 is a circuit diagram of an embodiment of a level shifter of a semiconductor device according to an aspect of the present invention.

Referring to FIG. 3, the level shifter includes four NMOS transistors N1 to N4, two PMOS transistors P1 and P2, and a voltage controlled delay unit 100. The voltage controlled delay unit 100 includes an inverter INV, an NMOS transistor N5, and a capacitor C.

The connection of the respective components of the level shifter of FIG. 3 is the same as that of the conventional level shifter of FIG. 1 except that the inverter INV of FIG. 1 is replaced by the voltage controlled delay unit 100. In the voltage controlled delay unit 100, a series connection of the NMOS transistor N5 having a gate to which a voltage control signal Vctl is applied and the capacitor C having one terminal connected to a ground voltage Vss is connected parallel with the inverter INV.

The operation of the level shifter of the semiconductor device according to this embodiment will now be described with reference to FIG. 3.

A description of the same operation as the operation of the conventional level shifter described with reference to FIGS. 1 and 2 will be omitted here, and only differences between the operations of the level shifter of FIG. 3 and the conventional level shifter of FIG. 1 will be described.

The voltage controlled delay unit 100 receives an input signal VIN, inverts it, and outputs an inverted input signal VINB with a delay time. This delay time is adjusted in a manner that charges the capacitor C with the inverted input signal VINB in response to the voltage control signal Vctl.

In this case, the voltage control signal Vctl can be originated from a mode register set (MRS) signal or a fuse option generated by the semiconductor device. The phase of the voltage control signal Vctl can be shifted using predetermined bits of data of a mode register (not shown). Alternatively, when a fuse (not shown) is connected, the phase of the voltage control signal Vctl can be shifted using a low-level voltage, and when a fuse is disconnected, the phase of the voltage control signal Vctl can be shifted using a high-level voltage.

When the voltage control signal Vctl is at a high level, the NMOS transistor N5 is turned on. Thus, it takes a long time to charge the capacitor C with a voltage of the inverted input signal VINB delivered via the inverter INV, so that a delay time of a signal applied to a gate of the fourth NMOS transistor N4 increases. When the voltage control signal Vctl is at a low level, the NMOS transistor N5 is turned off. Thus, the voltage of the inverted input signal VINB delivered via the inverter INV is not charged in the capacitor C, but is directly applied to the gate of the fourth NMOS transistor N4, so that the delay time of the signal applied to the gate of the fourth NMOS transistor N4 does not increase.

As a result, an inverter delay time Td_inv is adjusted by a time amount by which a rising delay time is greater than a falling delay time and equalized to a rising delay time Td_r of an output signal LS_OUT2 of the level shifter, so that the duty ratio of the output signal LS_OUT2 can be precisely controlled.

As described with reference to FIG. 2, a high bit cycle of a positive output signal LS_OUT2 is given by subtracting a rising delay time Td_r of the positive output signal LS_OUT2 from the sum of a current high bit cycle Tb and an inverter delay time Td_inv. Thus, when the inverter delay time Td_inv is controlled and equalized to the rising delay time Td_r, the high bit cycle of the positive output signal LS_OUT2 is equalized to the current high bit cycle Tb. In other words, since the high bit cycle of the positive output signal LS_OUT2 is equal to a high bit cycle Tb of an input signal VIN, the duty ratio of the positive output signal LS_OUT2 is exactly 50%.

In this manner, the level shifter of the semiconductor device according to the present embodiment controls a turn-on time of the NMOS transistor N4 by adjusting the delay time of the inverted input signal VINB applied to the gate of the fourth NMOS transistor N4 in response to the MRS signal or the fuse option generated in the semiconductor device. Thus, the inverted input signal VINB is delayed by a time amount by which a rising delay time is greater than a falling delay time, such that the duty ratio of the output signal LS_OUT2 is exactly 50%.

Figure 4:
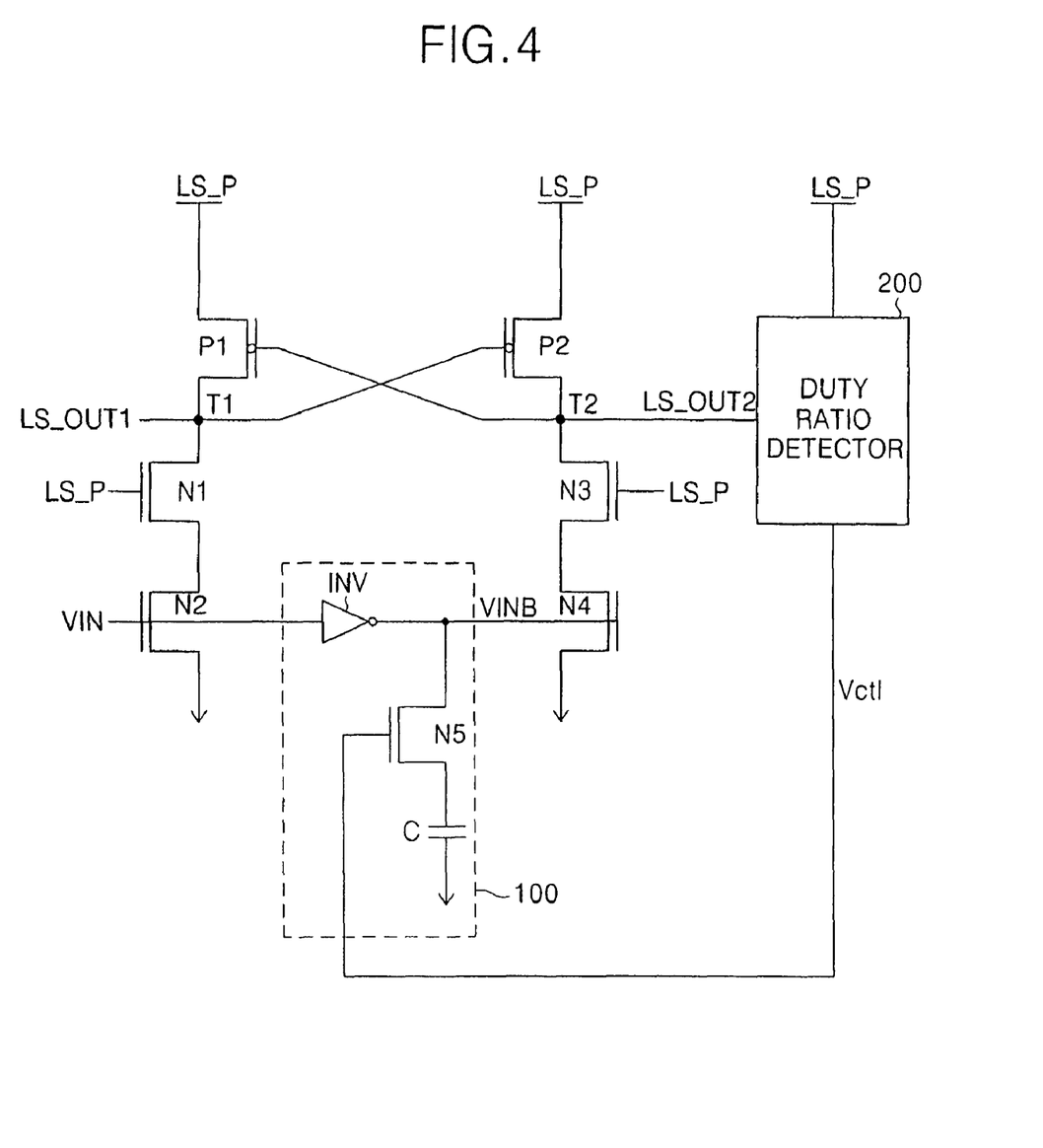
FIG. 4 is a circuit diagram of an embodiment of a level shifter of a semiconductor device according to another aspect of the present invention.

FIG. 4 is a circuit diagram of an embodiment of a level shifter of a semiconductor device according to another aspect of the present invention.

Referring to FIG. 4, the level shifter includes four NMOS transistors N1 to N4, two PMOS transistors P1 and P2, a voltage controlled delay unit 100, and a duty ratio detector 200. The voltage controlled delay unit 100 includes an inverter INV, an NMOS transistor N5, and a capacitor C.

The connection of respective components of the level shifter of FIG. 4 is the same as that of the level shifter of FIG. 3, except that the duty ratio detector 200 receives an output signal LS_OUT2 of the level shifter and outputs a voltage control signal Vctl and the voltage controlled delay unit 100 uses an output signal of the duty ratio detector 200 as the voltage control signal Vctl instead of an MRS signal or a fuse option.

Figure 5:
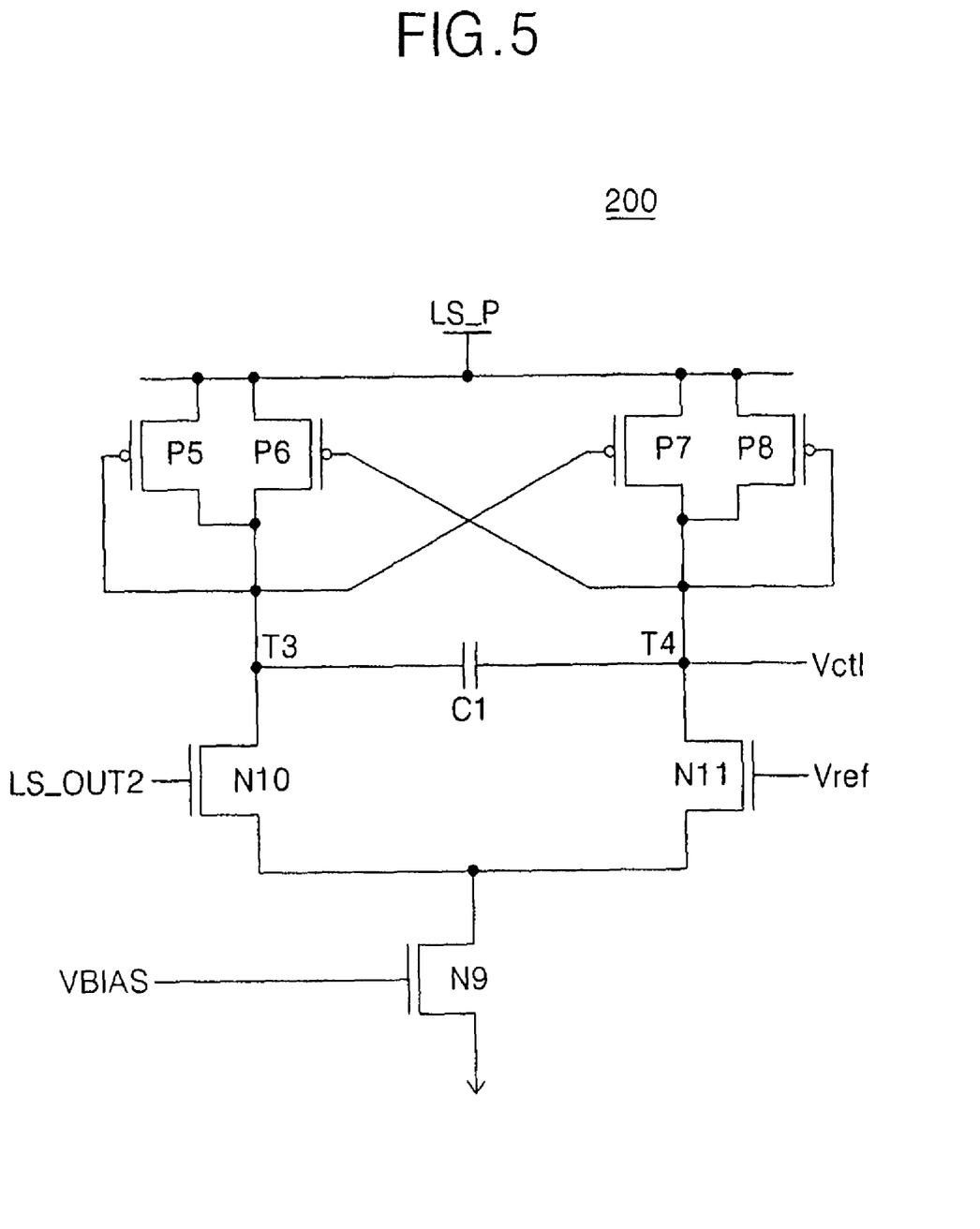
FIG. 5 is a circuit diagram of an embodiment of a duty ratio detector of the level shifter of the semiconductor device shown in FIG. 4.

FIG. 5 is a circuit diagram of an embodiment of the duty ratio detector of the level shifter of the semiconductor device shown in FIG. 4.

Referring to FIG. 5, the duty ratio detector 200 includes three NMOS transistors N9 to N11, four PMOS transistors P5 to P8, and a capacitor C1.

The duty ratio detector 200 is structurally similar to a differential amplifier. Specifically, a pair of parallel-connected PMOS transistors P5 and P6 and a pair of parallel-connected PMOS transistors P7 and P8 are connected in parallel. A power supply voltage LS_P is applied to sources of the pair of PMOS transistors P5 and P6 and the pair of PMOS transistors P7 and P8. A drain of the NMOS transistor N10 is connected to drains of the pair of PMOS transistors P5 and P6, and a drain of the NMOS transistor N11 is connected to drains of the pair of PMOS transistors P7 and P8. The NMOS transistor N9 has a drain connected to the drains of the NMOS transistors N10 and N11 and a source connected to a ground voltage Vss.

Also, a third connection point T3 between the pair of parallel-connected PMOS transistors P5 and P6 and the NMOS transistor N10 is connected to gates of the PMOS transistors P5 and P7, a fourth connection point T4 between the pair of parallel-connected PMOS transistors P7 and P8 and the NMOS transistor N11 is connected to gates of the PMOS transistors P6 and P8, and the capacitor C1 is connected between the third and fourth connection points T3 and T4.

Meanwhile, a bias voltage VBIAS is applied from a predetermined direct-current (DC) voltage generator (not shown) to a gate of the NMOS transistor N9, an output signal LS_OUT2 of the level shifter is output to a gate of the NMOS transistor N10, and a reference voltage signal Vref is applied from a predetermined reference voltage generator (not shown) to a gate of the NMOS transistor N11, so that the duty ratio detector 200 generates an output signal Vctl at the fourth connection point T4.

Operation of the level shifter of the semiconductor device according to the present embodiment will now be described with reference to FIGS. 4 and 5.

A description of the same operation as the operation of the level shifter as described with reference to FIG. 3 will be omitted here, and only differences between the operations of the level shifter of FIG. 3 and the level shifter of FIG. 4 will be described.

The duty ratio detector 200 rapidly detects a voltage difference between input signals applied via two input terminals and outputs the voltage difference as an output signal. Thus, the duty ratio detector 200 receives the output signal LS_OUT2 of the level shifter, detects a duty ratio of the output signal LS_OUT2, and outputs the voltage control signal Vctl for controlling a delay time of an inverted input signal VINB according to the distortion extent of the output signal LS_OUT2.

In other words, when the duty ratio of the output signal LS_OUT2 is exactly 50%, a constant voltage is charged in or discharged from the capacitor C so that the output signal LS_OUT2 is maintained at a constant DC voltage level. However, when the duty ratio of the output signal LS_OUT2 is more than 50%, an input voltage LS_OUT2 applied to a first input terminal of the duty ratio detector 200 is higher than a reference voltage Vref applied to a second input terminal thereof. Thus, an output voltage level of the duty ratio detector 200 generally rises so that the duty ratio detector 200 outputs a high-level voltage control signal Vctl.

By comparison, when the duty ratio of the output signal LS_OUT2 is less than 50%, the input voltage LS_OUT2 applied to the first input terminal of the duty ratio detector 200 is lower than the reference voltage Vref applied to the second input terminal thereof. Thus, the output voltage level of the duty ratio detector 200 generally drops so that the duty ratio detector 200 outputs a low-level voltage control signal Vctl.

When the voltage control signal Vctl is at a high level, the NMOS transistor N5 is turned on. Thus, it takes a longer time to charge the capacitor C1 with a voltage of an inverted input signal VINB delivered via the inverter INV so that a delay time of a signal applied to a gate of the fourth NMOS transistor N4 increases. When the voltage control signal Vctl is at a low level, the NMOS transistor N5 is turned off. Thus, the voltage of the inverted input signal VINB delivered via the inverter INV is not charged in the capacitor C, but is directly applied to the gate of the fourth NMOS transistor N4, so that the delay time of the signal applied to the gate of the fourth NMOS transistor N4 does not increase.

Therefore, the level shifter of the semiconductor device according to the present embodiment variably controls the delay time of the inverted input signal VINB applied to the gate of the fourth NMOS transistor N4 in response to the output signal of the duty ratio detector 200, which depends on the duty ratio of the output signal LS_OUT2 of the level shifter, to control a point in time at which the NMOS transistor N4 is turned on. Thus, the inverted input signal VINB is delayed by a time amount by which the rising delay time is greater than the falling delay time, so that the duty ratio of the output signal LS_OUT2 can be controlled to be exactly 50%.

According to aspects of the present invention as described above, the level shifter of a semiconductor device and a method for controlling a duty ratio in the device can control the delay time of the input signal to maintain the duty ratio of the output signal constant. As a result, high-speed systems can perform precise level shifting operation to improve operating characteristics.

Exemplary embodiments in accordance with aspects of the present invention have been disclosed herein and, although specific terms are employed, they are used and are to be interpreted in a generic and descriptive sense only and not for purpose of limitation. Accordingly, it will be understood by those of ordinary skill in the art that various changes in form and details can be made without departing from the spirit and scope of the present invention as set forth in the following claims.

What is claimed is:

1. A level shifter of a semiconductor device comprising:
a voltage controlled delay unit configured to receive an input signal, invert a level of the input signal, and delay the inverted input signal to output a delayed inverted signal, a delay time of the delayed inverted signal being adjusted in a manner that performs a charging operation with the inverted signal in response to a delay control signal, wherein the voltage controlled delay unit comprises: an inverter configured to receive the input signal and to invert a level of the input signal to output the inverted input signal to the gate of the second NMOS transistor; a capacitor having one terminal to which the ground voltage is applied; and a fifth NMOS transistor having a drain to which an output signal of the inverter is applied and a source connected to the other terminal of the capacitor, and configured to deliver the output signal of the inverter to the capacitor to charge the capacitor with the output signal in response to the delay control signal applied to a gate of the fifth NMOS transistor;
a level shifting unit configured to amplify a voltage difference between the input signal and the delayed inverted signal to output a pair of level-shifted signals having different phases, wherein the level shifting unit comprises: a voltage difference generating portion configured to sense a voltage difference between the input signal and the delayed inverted signal in response to the input signal and the delayed inverted signal to generate a voltage difference generated between a pair of input nodes; a voltage difference delivering portion configured to deliver the voltage difference generated between the pair of input nodes to a pair of output nodes in response to a power supply voltage; and a level-shifted signal output portion configured to amplify the voltage difference delivered to the pair of output nodes to output the pair of level-shifted signals.

2. The level shifter according to claim 1, wherein the voltage controlled delay unit is configured to use a mode register set (MRS) signal as the delay control signal, the mode register set signal being originated from predetermined data bits of a mode register in the semiconductor device.

3. The level shifter according to claim 1, wherein the voltage difference generating portion comprises:
a first NMOS transistor having a source to which a ground voltage is applied and a gate to which the input signal is applied; and
a second NMOS transistor having a source to which the ground voltage is applied and a gate to which the delayed inverted signal is applied.

4. The level shifter according to claim 3, wherein the voltage difference delivering portion comprises:
a third NMOS transistor having a source connected to a drain of the first NMOS transistor and a gate to which the power supply voltage is applied; and
a fourth NMOS transistor having a source connected to a drain of the second NMOS transistor and a gate to which the power supply voltage is applied.

5. The level shifter according to claim 4, wherein the level-shifted signal output portion comprises:
a first PMOS transistor having a source to which the power supply voltage is applied and a gate to which one of the pair of level-shifted signals is applied; and
a second PMOS transistor having a source to which the power supply voltage is applied and a gate to which the other of the pair of level-shifted signals is applied,
wherein the pair of level-shifted signals are output from a connection point between the first PMOS transistor and the third NMOS transistor and a connection point between the second PMOS transistor and the fourth NMOS transistor.

6. The level shifter according to claim 1, wherein the voltage controlled delay unit is configured to adjust a delay time of the inverter to equalize a rising delay time of one of the pair of level-shifted signals to the delay time of the inverter so that a duty ratio of the one of the pair of level-shifted signals is precisely controlled.

7. The level shifter according to claim 6, wherein in the voltage controlled delay unit, when the delay control signal is at a high level, the fifth NMOS transistor is configured to be turn on so that the inverted input signal is charged in the capacitor to increase the inverter delay time, and
when the delay control signal is at a low level, the fifth NMOS transistor is configured to be turn off so that the inverted input signal is not charged in the capacitor not to increase the inverter delay time.

8. The level shifter according to claim 1, wherein the voltage controlled delay unit is configured to use a fuse option as the delay control signal, the fuse option configured to output a low-level signal when a fuse in the semiconductor device is connected and a high-level signal when the fuse is disconnected.

9. A level shifter of a semiconductor device comprising: a voltage controlled delay unit configured to receive an input signal, invert a level of the input signal, and delay the inverted input signal to output a delayed inverted signal, a delay time of the delayed inverted signal being adjusted in a manner that performs a charging operation with the inverted signal in response to a delay control signal; a level shifting unit configured to amplify a voltage difference between the input signal and the delayed inverted signal to output a pair of level-shifted signals having different phases; and a duty ratio detector configured to receive one of the pair of level-shifted signals and to detect a duty ratio of the received level-shifted signal to output the delay control signal according to a distortion extent of the received level-shifted signal, wherein the duty ratio detector comprises: a first PMOS transistor pair including third and fourth PMOS transistors connected in parallel and having sources to which the power supply voltage is applied; a second PMOS transistor pair including fifth and sixth PMOS transistors connected in parallel and having sources to which the power supply voltage is applied; fifth and sixth NMOS transistors having drains connected to drains of the first and second PMOS transistor pairs, respectively; a seventh NMOS transistor having a drain connected to the drains of the fifth and sixth NMOS transistors, a source connected to the ground voltage, and a gate to which a bias voltage is applied; and a capacitor having one terminal connected to a first connection point between the first PMOS transistor pair and the fifth NMOS transistor and the other terminal connected to a second connection point between the second PMOS transistor pair and the sixth NMOS transistor, wherein the first connection point is connected to gates of the third and fifth PMOS transistors and the second connection point is connected to gates of the fourth and sixth PMOS transistors so that one of the pair of level-shifted signals is applied to a gate of the fifth NMOS transistor, a reference voltage signal is applied to a gate of the sixth NMOS transistor, and the duty ratio detector is configured to compare a voltage level of the applied one of the pair of level-shifted signals with a voltage level of the reference voltage signal and to output the delay control signal from the second connection point.

10. The level shifter according to claim 9, wherein the duty ratio detector is configured to output a low-level delay control signal when the duty ratio of one of the pair of level-shifted signals does not exceed a predetermined value, and to output a high-level delay control signal when the duty ratio of the one of the pair of level-shifted signals exceeds the predetermined value.

11. A method for controlling a duty ratio using a level shifter of a semiconductor device, the level shifter comprising an voltage controlled delay unit including an inverter configured to receive an input signal, a capacitor having one terminal to which a ground voltage is applied, and an NMOS transistor connecting the other terminal of the capacitor with an output terminal of the inverter and having a gate to which a delay control signal is applied, the level shifter configured to shift a level of the input signal to output a pair of level-shifted signals, the method comprising:
  receiving the input signal and inverting the level of the input signal to output an inverted input signal;
  determining whether or not a voltage of the input signal is to be charged in the capacitor based on a level of the delay control signal;
  controlling a delay time of the input signal depending on whether or not the voltage of the input signal is charged in the capacitor to output a delayed input signal; and
  controlling a duty ratio of one of the pair of level-shifted signals using the delayed input signal.

12. The method according to claim 11, wherein controlling the delay time of the input signal depending on whether or not the voltage of the input signal is charged in the capacitor to output the delayed input signal comprises:
  when the delay control signal is at a low level, not charging a voltage of the inverted input signal in the capacitor to output the inverted input signal without increasing a delay time of the inverted input signal; and
  when the delay control signal is at a high level, charging the voltage of the inverted input signal in the capacitor to output the inverted input signal with an increased delay time.

13. The method according to claim 11, wherein determining whether or not the voltage of the input signal is to be charged in the capacitor based on the level of the delay control signal is performed using an mode register set (MRS) signal as the delay control signal, the MRS signal being originated from predetermined data bits of a mode register in the semiconductor device.

14. The method according to claim 11, wherein determining whether or not the voltage of the input signal is to be charged in the capacitor based on the level of the delay control signal is performed using a fuse option as the delay control signal, the fuse option outputting a low-level signal when a fuse in the semiconductor device is connected and a high-level signal when the fuse is disconnected.

15. The method according to claim 11, wherein controlling a duty ratio of one of the pair of level-shifted signals using the delayed input signal comprises:
  controlling a delay time of the inverter to equalize a rising delay time of an output signal to the delay time of the inverter to delay a point in time at which the output signal rises so that a duty ratio of the output signal can be precisely controlled.

16. The method according to claim 11, wherein determining whether or not the voltage of the input signal is to be charged in the capacitor based on the level of the delay control signal comprises:
  receiving one of the pair of level-shifted signals, detecting a duty ratio of the received level-shifted signal to generate the delay control signal according to the distortion extent of the received level-shifted signal.

17. The method according to claim 16, wherein receiving one of the pair of level-shifted signals, detecting a duty ratio of the received level-shifted signal to generate the delay control signal according to the distortion extent of the received level-shifted signal comprises:
  outputting a low-level delay control signal when the duty ratio of one of the pair of level-shifted signals does not exceed a predetermined value and outputting a high-level delay control signal when the duty ratio of the one of the pair of level-shifted signals exceeds the predetermined value.

* * * * *